(12) United States Patent
Motegi et al.

(10) Patent No.: US 8,064,212 B2
(45) Date of Patent: Nov. 22, 2011

(54) HYBRID INTEGRATED CIRCUIT DEVICE

(76) Inventors: Masami Motegi, Gunma (JP); Masashi Terauchi, Gunma (JP); Takashi Higo, Gunma (JP)

( * ) Notice: Subject to any disclaimer, the term of this patent is extended or adjusted under 35 U.S.C. 154(b) by 562 days.

(21) Appl. No.: 12/233,682

(22) Filed: Sep. 19, 2008

(65) Prior Publication Data

US 2009/0086457 A1 Apr. 2, 2009

(30) Foreign Application Priority Data

Sep. 26, 2007 (JP) ................... 2007-249555

(51) Int. Cl.
*H05K 7/00* (2006.01)
(52) U.S. Cl. ......... 361/760; 361/807; 361/766; 174/521
(58) Field of Classification Search ................... 361/760, 361/766, 768, 781, 782, 807, 808, 809, 812; 174/252, 255, 256, 259, 260, 263, 520, 521, 174/8, 76
See application file for complete search history.

(56) References Cited

U.S. PATENT DOCUMENTS

| 5,535,101 A * | 7/1996 | Miles et al. ................. 361/808 |
| 5,737,191 A * | 4/1998 | Horiuchi et al. .............. 361/764 |
| 5,808,872 A * | 9/1998 | Ozawa ......................... 361/760 |
| 5,855,821 A * | 1/1999 | Chau et al. ................... 252/514 |
| 6,661,104 B2 * | 12/2003 | Jiang et al. .................... 257/789 |
| 2001/0023983 A1 * | 9/2001 | Kobayashi et al. ........... 257/698 |
| 2005/0051358 A1 * | 3/2005 | Kawamoto et al. .......... 174/260 |

FOREIGN PATENT DOCUMENTS

| JP | 10-201250 | 7/1998 |
| JP | 29-51102 | 7/1999 |

* cited by examiner

*Primary Examiner* — Hoa C Nguyen
(74) *Attorney, Agent, or Firm* — Fish & Richardson P.C.

(57) ABSTRACT

In a hybrid integrated circuit device that uses a metal substrate, a sound noise is prevented, which would otherwise be generated due to transmission, to the metal substrate, of vibration caused when a ceramic capacitor expands and contracts by switching ON and OFF a transistor. For improving a heat dissipation effect, a switching transistor driven by a driving pulse and a ceramic capacitor connected to the switching transistor are incorporated on a conductive path on an insulated metal substrate. Both ends of the ceramic capacitor are fixed to the conductive path by solders which are covered with a hard resin to be protected from a solder crack by thermal expansion of the metal substrate. The ceramic capacitor and the hard resin are wholly covered with a soft resin which absorbs noise due to expansion caused when the ceramic capacitor is switched, so that the metal substrate is prevented from resonating.

4 Claims, 8 Drawing Sheets

4μs 1 subfield 1 subfield 1 frame

HYBRID INTEGRATED CIRCUIT DEVICE

This application claims priority from Japanese Patent Application Number JP 2007-249555 filed on Sep. 26, 2007, the content of which is incorporated herein by reference in its entirety.

BACKGROUND OF THE INVENTION

1. Field of the Invention

The present invention relates to a hybrid integrated circuit device in which a sound noise is prevented, which would otherwise be generated due to a pulse voltage applied to a ceramic capacitor for bootstrap when a switching transistor, used in a discharge maintaining circuit of a plasma display for large-sized flat televisions or the like, is turned ON and OFF by a driving pulse.

2. Description of the Related Art

The plasma display is used on large-sized televisions or the like.

As shown in FIG. 2, an image control circuit 13 of a plasma display sends control signals to an address driver and a scan driver, and maps a luminous unit (cell). Next, the image control circuit sends control signals, as shown in FIG. 3A, to discharge maintaining circuits 12A and 12B that constitute a hybrid integrated circuit, and makes the cell discharge at intervals of four microseconds. Mapping is performed in every gradation of brightness (subfield=one millisecond), an image of one shot is achieved by discharging, and the mapping and the discharging are repeated at 60 frames per second, thereby achieving moving pictures.

As shown in FIG. 4, in the discharge maintaining circuits 12A and 12B, a supply voltage E from a power supply circuit is applied to bootstrap capacitors C1, C3, and C4. Furthermore, pulse signals of 250 kHz are applied to a terminal HIN and a terminal LIN of a driver IC 17 from the image control circuit 13, so that pulse signals of 250 kHz are generated from a terminal HO and a terminal LO of the driver IC 17.

The high-level pulse signal generated from the terminal HO of the driver IC 17 is applied to bases of switching transistors Q1 and Q2 in a pre-driver 18, so that the switching transistor Q1 is turned ON and the transistor Q2 is turned OFF. Accordingly, the discharge voltage of the electric charge that is charged in the bootstrap capacitor C1 while the switching transistor Q1 is OFF, is superimposed on the supply voltage via the switching transistor Q1, and is applied to gates of IGBT1 and IGBT2 in a driver 19 via the switching transistor Q1, so that the transistors IGBT1 and the IGBT2 in the driver 19 are turned ON.

In this manner, the pulse signal of 250 kHz generated from the image control circuit 13 is driven with the cycles of 1 kHz and 60 Hz, and controlling the electric discharge of the plasma display is performed.

The above-described discharge maintaining circuits 12A and 12B are incorporated on an insulated metal substrate for improving a heat dissipation effect to form a hybrid integrated circuit, as is described in Japanese Patent No. 2951102 by the present applicant.

FIG. 6 shows this hybrid integrated circuit. A ceramic capacitor C1 and a switching transistor Q1 are incorporated on a conductive path 32 on a metal substrate 30 that is insulated by providing an insulating layer 31 thereon.

FIG. 7 is a view showing that electrodes 34, 34 of the ceramic capacitor CI are fixed on the conductive paths 32, 32 formed on the metal substrate 30 by solders 33, 33. When the ceramic capacitor C1 is fixed to the conductive path 32 by the solders 33, 33, a solder crack might be generated, which causes insulation failure. Thus, in order to prevent the insulation failure being occurred, the ceramic capacitor C1 is covered with a hard resin 35 such as an epoxy resin.

FIG. 8 is a cross-sectional view of the ceramic capacitor C1. The ceramic capacitor C1 includes ceramic layers 35, 35 laminated between the electrodes 34, 34. Ceramic is widely used for capacitors, because of a high dielectric constant and a high reliability. However, when a driving pulse of 1 kHz and a driving pulse of 60 Hz are applied to the electrodes 34, 34, the ceramic layers 35, 35 will be distorted because of the piezoelectric effect. On the other hand, when the driving pulse is not applied, the ceramic layers 35, 35 will recover their original shape. Because such operation is repeated throughout the driving pulse signal application, the ceramic capacitor vibrates and generates a sound noise.

Japanese Patent Application Publication No. 10-201250 discloses that vibration is suppressed by using a ceramic capacitor in a chopper type boosting circuit.

However, in the hybrid integrated circuit used for a discharge maintaining circuit of a plasma display or the like, as described above, the ceramic capacitor is molded with an epoxy resin to protect from a solder crack. Because the epoxy resin is hard, vibration of the ceramic capacitor is transferred as it is. Furthermore, the hybrid integrated circuit used for the discharge maintaining circuit of a plasma display is attached on the metal substrate with the insulated surface in order to improve a heat dissipation effect. However, when the hybrid integrated circuit is formed on the metal substrate, the vibration of the ceramic capacitor resonates to vibrate the metal substrate, so that a sound noise is generated.

SUMMARY OF INVENTION

According to a first aspect of the present invention, in a hybrid integrated circuit device that uses a metal substrate for improving a heat dissipation effect, it is prevented that, when a ceramic capacitor expands and contracts by ON and OFF of a switching transistor, vibration is generated and is transferred to the metal substrate so that a sound noise is generated. It provides a hybrid integrated circuit device that incorporates a switching transistor driven by a driving pulse, and a ceramic capacitor connected to the switching transistor to a conductive path on an insulated metal substrate. Both ends of the ceramic capacitor are adhered to the conductive path by solders, and each of the solders is covered with a hard resin to protect from a solder crack by a thermal expansion of the metal substrate. The ceramic capacitor and the hard resin are wholly covered with a soft resin, and the soft resin absorbs a noise generated by the ceramic capacitor due to expansion and contraction at the time of switching so that the metal substrate is prevented from resonating.

The first aspect of the present invention provides the hybrid integrated circuit device in which the sound noise generated by the ceramic capacitor due to expansion at the time of switching is covered with a silicone resin that is the soft resin.

The first aspect of the present invention provides the hybrid integrated circuit device in which solders that fix the both ends of ceramic capacitor to the conductive path are covered with an epoxy resin that is the hard resin.

The first aspect of the present invention provides the hybrid integrated circuit device in which the surface of the metal substrate is covered with a transfer molded epoxy resin.

BRIEF DESCRIPTION OF THE DRAWINGS

FIG. 3A is a diagram showing a signal waveform in one subfield, and FIG. 3B is a diagram showing a signal waveform in one frame;

DESCRIPTION OF THE INVENTION

Figure 1:
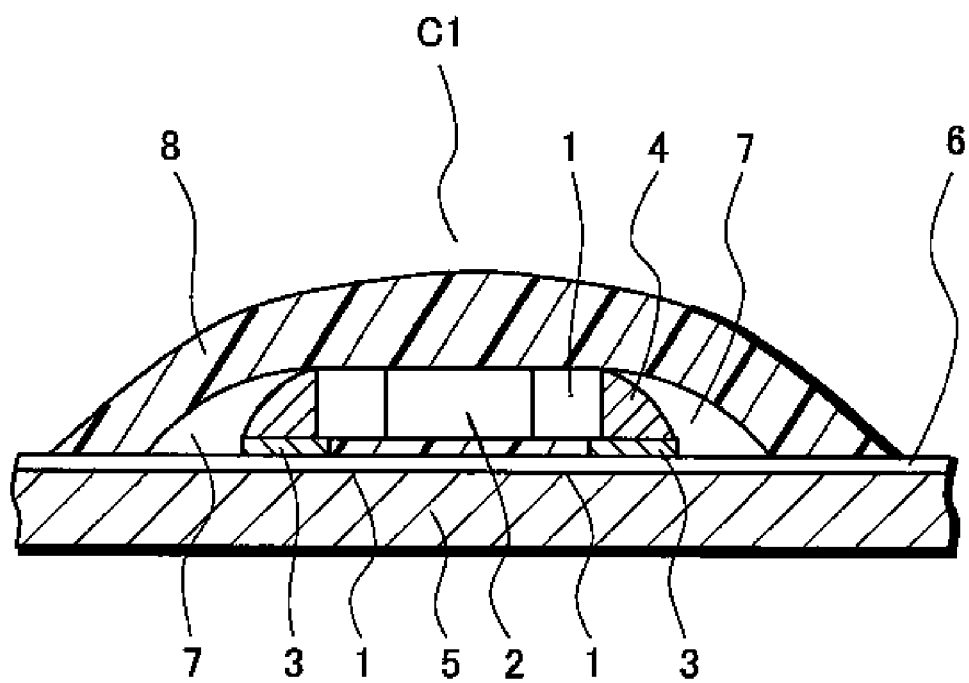
FIG. 1 is a cross-sectional view showing a part of a hybrid integrated circuit device according to a preferred embodiment of the present invention.
Figure 2:
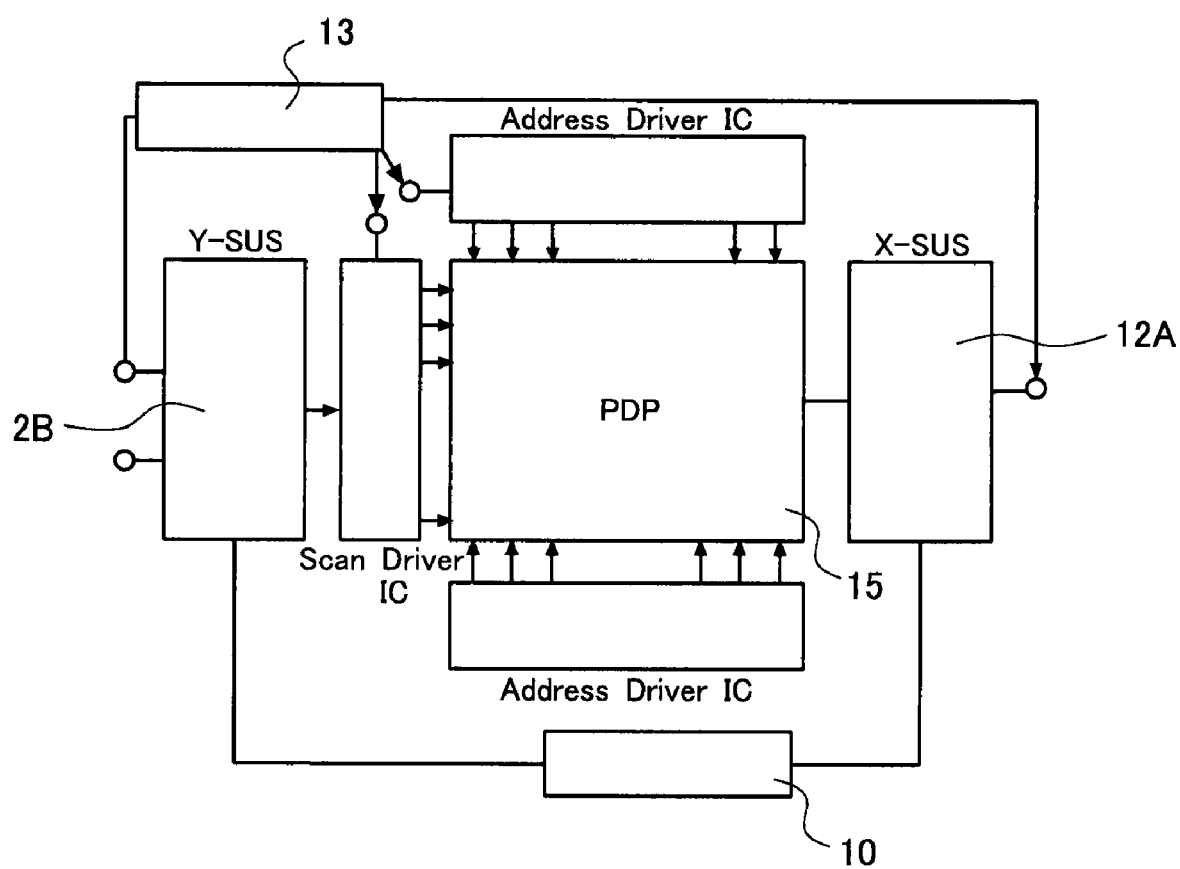
FIG. 2 is a block diagram of an image control circuit of a plasma display used for explaining the hybrid integrated circuit device according to the preferred embodiment.
Figure 3A:
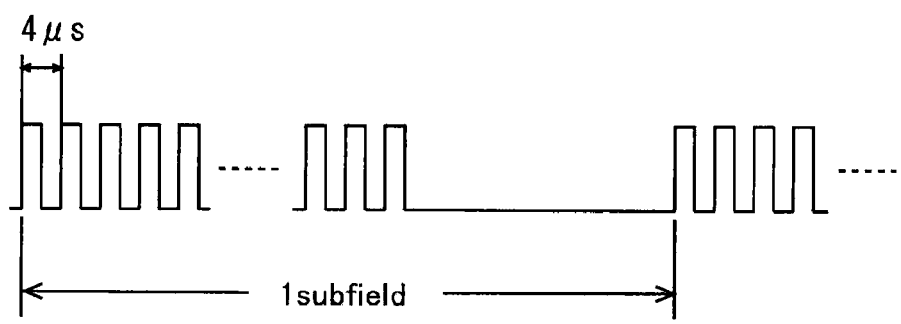
FIGS. 3A and 3B are diagrams showing pulse signal waveforms of FIG. 2.
Figure 3B:
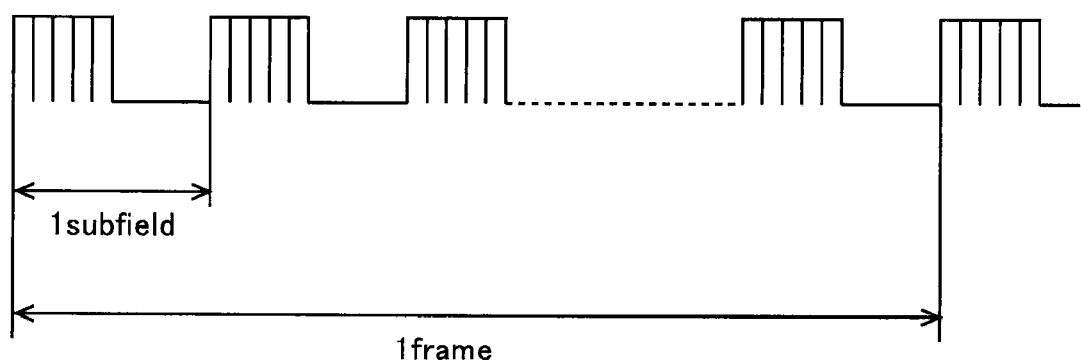
Figure 4:
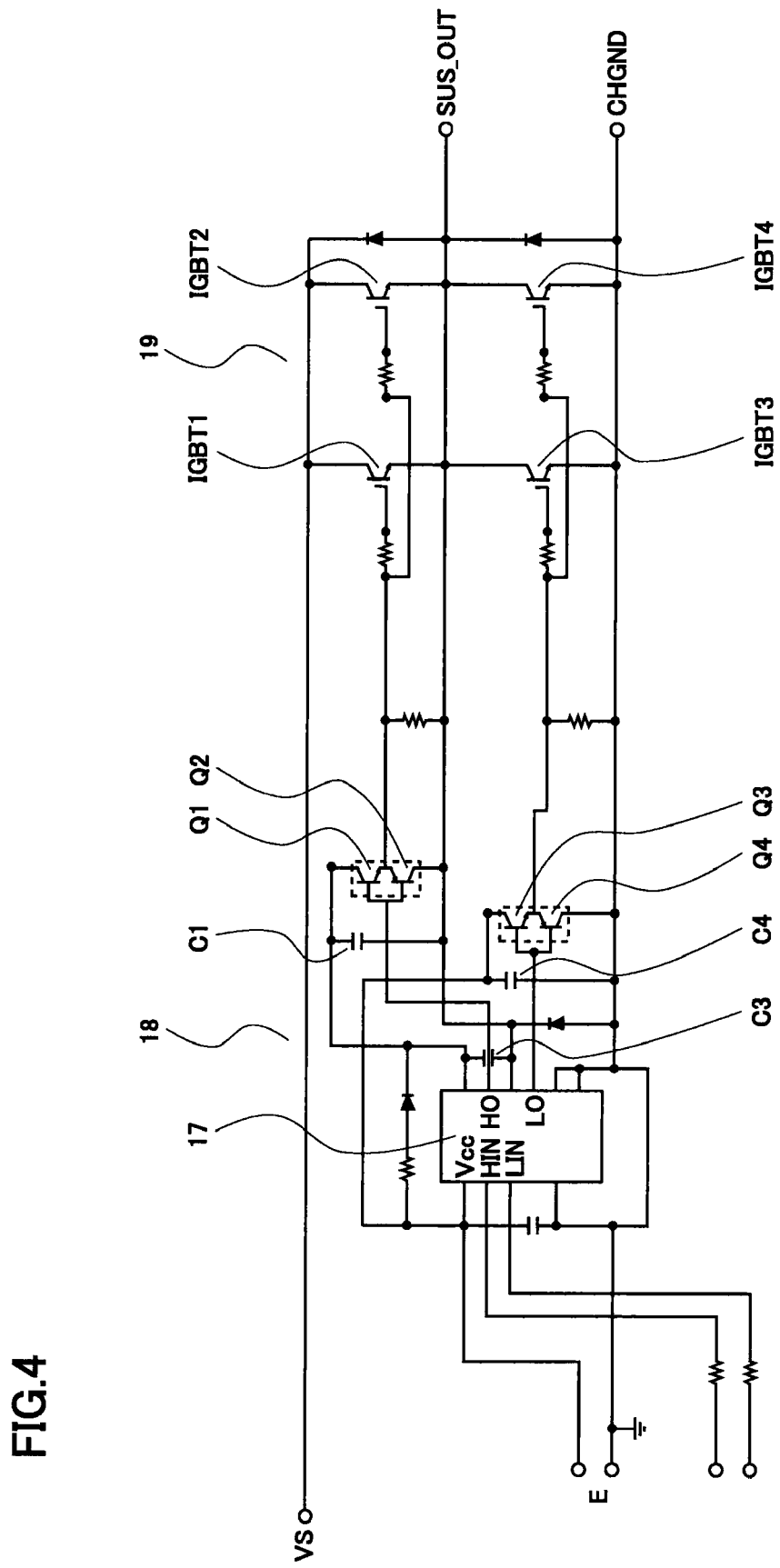
FIG. 4 is a diagram showing a discharge maintaining circuit for explaining a pulse drive portion in the hybrid integrated circuit device according to the preferred embodiment.
Figure 5:
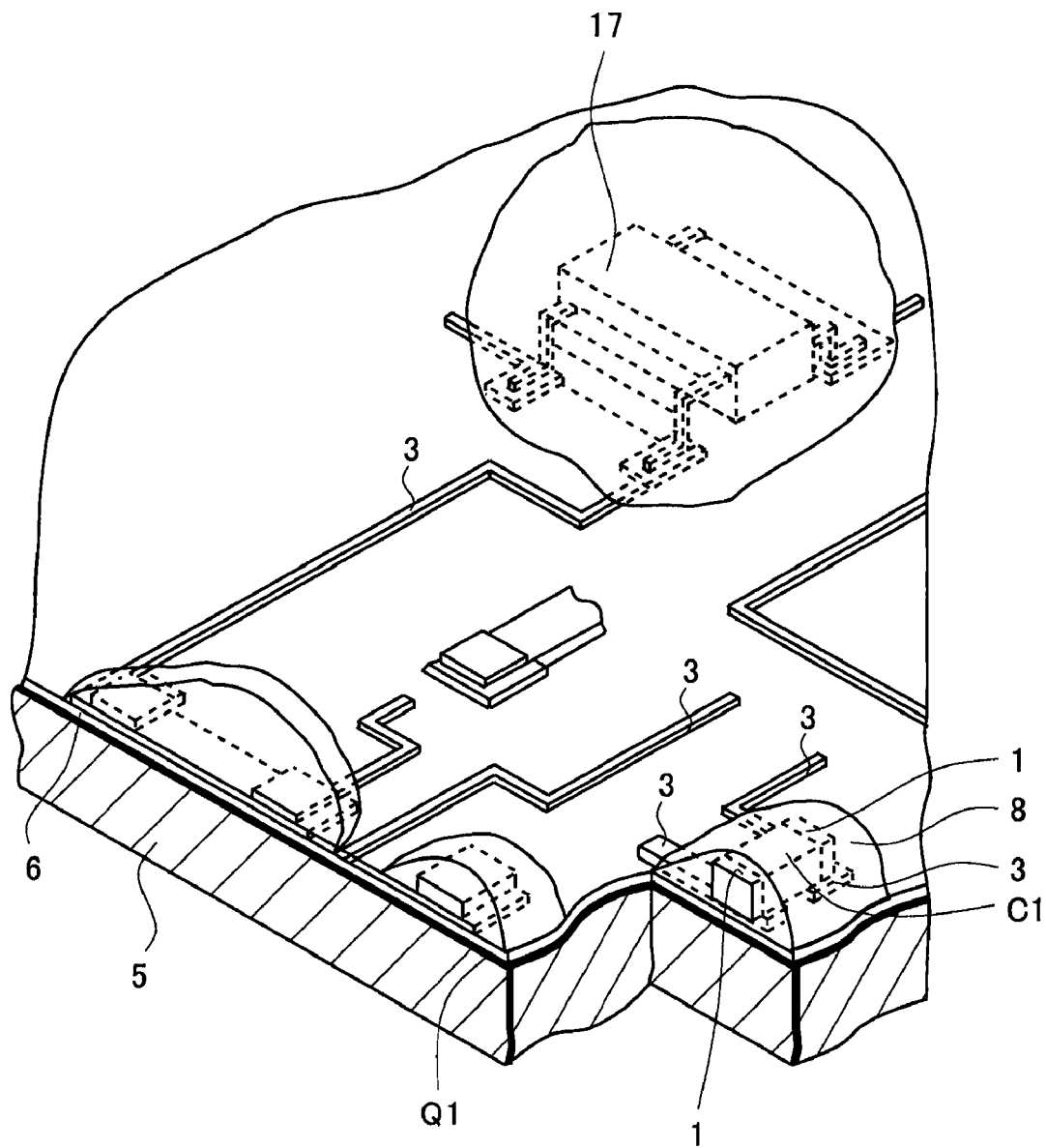
FIG. 5 is a perspective view for explaining the overall hybrid integrated circuit device according to the preferred embodiment.
Figure 6:
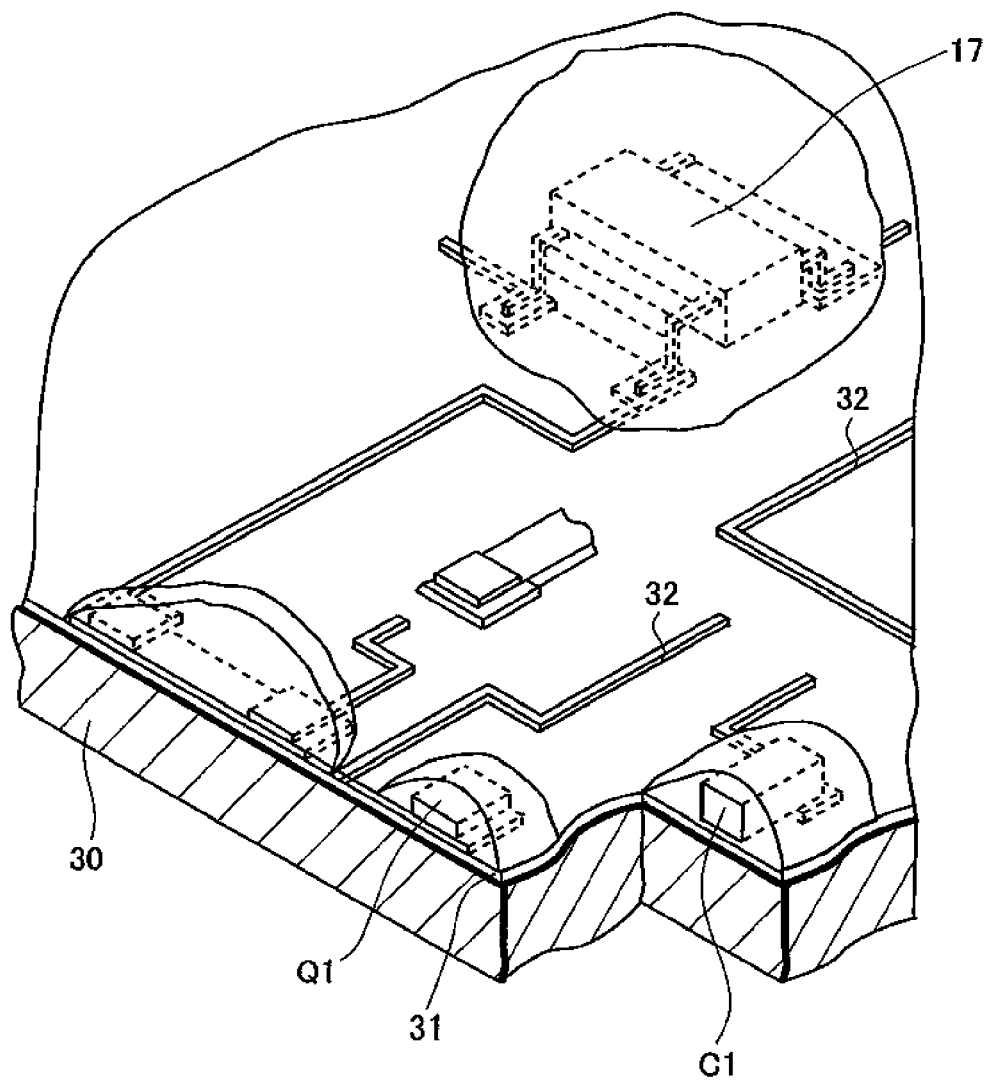
FIG. 6 is a perspective view for explaining an overall conventional hybrid integrated circuit device.
Figure 7:
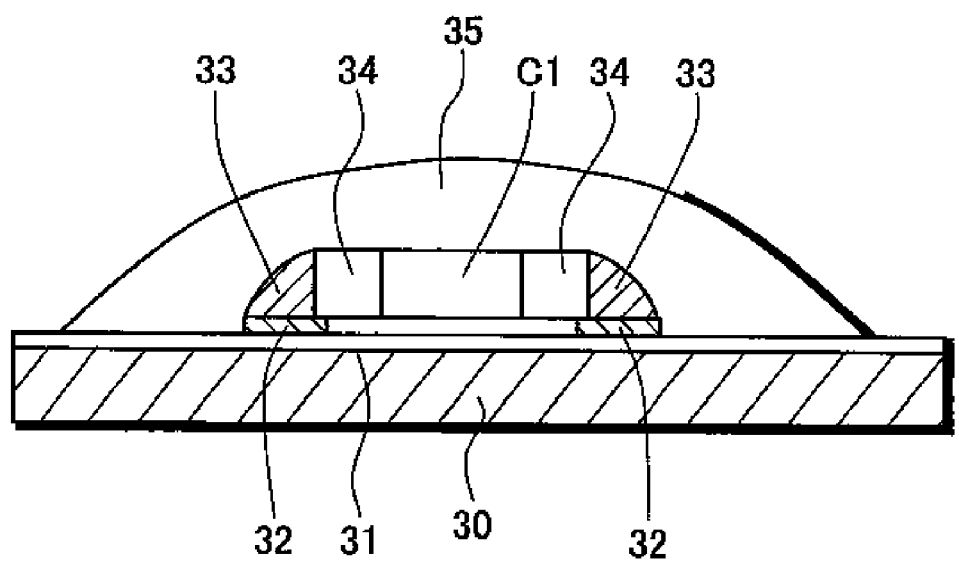
FIG. 7 is a cross-sectional view showing a part of the conventional hybrid integrated circuit device.
Figure 8:
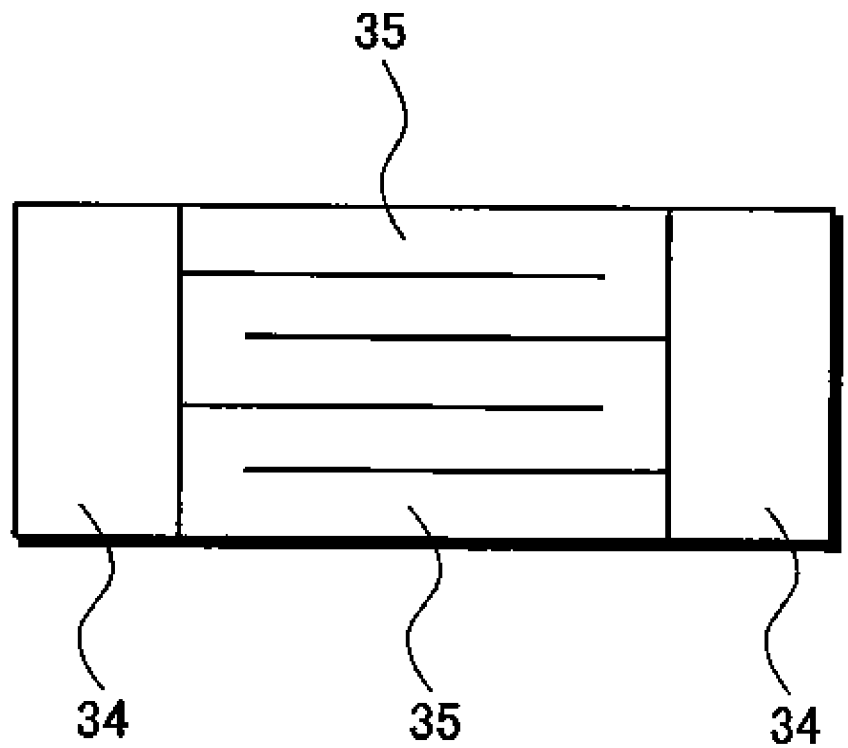
FIG. 8 is a cross-sectional view of a ceramic capacitor that is generally used.

FIG. 1 is a cross-sectional view showing a part of a hybrid integrated circuit device according to a preferred embodiment of the present invention. FIG. 2 is a block diagram of an image control circuit of a plasma display used for explaining the hybrid integrated circuit device according to the preferred embodiment. FIGS. 3A and 3B are diagrams showing pulse signal waveforms of FIG. 2. FIG. 4 is a diagram showing a discharge maintaining circuit for explaining a pulse drive portion in the hybrid integrated circuit device according to the preferred embodiment. FIG. 5 is a perspective view for explaining the overall hybrid integrated circuit device according to the preferred embodiment.

FIG. 1 is a cross-sectional view showing a part of the hybrid integrated circuit device according to the preferred embodiment. The hybrid integrated circuit device is used for a discharge maintaining circuit of a plasma display, for example.

A ceramic capacitor C1 includes electrodes 1, 1 at both ends thereof and a ceramic 2 provided between the electrodes 1, 1. The electrodes at both ends of the ceramic capacitor C1 are fixed to conductive paths 3, 3 provided on an insulating layer 6 on a metal substrate 5 by solders 4, 4. The surface of each of the solders 4, 4 is covered with a hard resin 7 such as an epoxy resin. In addition, both the ceramic capacitor C1 and the hard resin 7 are wholly covered with a soft resin 8 such as a silicone resin.

FIG. 2 is a block diagram of the image control circuit of the plasma display that uses the hybrid integrated circuit device according to the preferred embodiment. The image control circuit includes the hybrid integrated circuit device according to the preferred embodiment that includes the discharge maintaining circuits 12A and 12B, a screen control circuit 13, and a plasma display 15.

As shown in FIG. 3A, when control voltages are applied to the discharge maintaining circuits 12A and 12B from the image control circuit 13, a pulse signal of 250 kHz is generated during one subfield (one millisecond) from the discharge maintaining circuits 12A and 12B, and address scan mapping is performed.

As shown in FIG. 3B, such operation is repeated so as to display moving pictures with 60 frames per second.

FIG. 4 is a diagram showing the discharge maintaining circuits 12A and 12B that forms the hybrid integrated circuit device according to the preferred embodiment.

The discharge maintaining circuits 12A and 12B include the driver IC 17, the pre-driver 18 composed of the switching transistors Q1, Q2, Q3, and Q4 and the bootstrap capacitors C1, C2, and C4, and the driver 19 composed of the IGBT1, the IGBT2, the IGBT3, and the IGBT4. The bootstrap capacitors C1, C2, and C4 are ceramic capacitors.

Next, the operation by the discharge maintaining circuits 12A and 12B will be described. A supply voltage E from the power supply circuit is applied to the bootstrap capacitors C1, C3, and C4. Furthermore, a pulse signal of 250 kHz is applied to the terminal HIN and the terminal LIN of the driver IC 17 from the image control circuit 13, so that the voltage-changed pulse signals of 250 kHz are generated from the terminal HO and the terminal LO of the driver IC 17.

The high-level pulse signal generated from the terminal HO of the driver IC 17 is applied to bases of the switching transistors Q1 and Q2 in the pre-driver 18, so that the switching transistor Q1 is turned ON and the transistor Q2 is turned OFF. Accordingly, the discharge voltage of the electric charge that is charged in the bootstrap capacitor C1 while the switching transistor Q1 is OFF, is superimposed on the supply voltage E via the switching transistor Q1, and is applied to gates of the IGBT1 and the IGBT2 in the driver 19 via the switching transistor Q1, so that the IGBT1 and the IGBT2 in the driver 19 are turned ON.

As described above, although the pulse signal applied to the bases of the pre-driver 18 from the driver IC 17 was 5 V, the driving voltages of the IGBT1 and the IGBT2 in the driver 19 are boosted in the range of 15 V to 18 V in the pre-driver 18. The driving voltages are boosted in the range of 15 V to 18 V, so that the loss of the IGBT1 and the IGBT2 decreases.

When the IGBT1 and the IGBT2 turn ON, the supply voltage from a terminal VS is outputted to a terminal SUS, terminals T1, T2, and T3, via the IGBT1 and the IGBT2.

In this manner, the pulse signal of 250 kHz generated from the image control circuit 13 and pulse signals of 1 kHz and 60 Hz are applied to the terminal SUS_OUT of the plasma display 15, thereby achieving a moving picture of one field with 60 frames per second and electric discharging for one subfield.

Similarly, the low-level pulse signal generated from the terminal LO of the driver IC 17 is applied to bases of the switching transistors Q3 and Q4 in the pre-driver 18, so that the transistor Q4 is turned ON and the transistor Q3 is turned OFF. Accordingly, the discharge voltage of the electric charge that is charged in the bootstrap capacitors C3 and C4 while the switching transistor Q4 is OFF, is superimposed via the switching transistor Q4, and is applied to gates of the IGBT3 and the IGBT4 in the driver 19 via the switching transistor Q4, so that the IGBT3 and the IGBT4 in the driver 19 are turned ON.

Because the IGBT3 and the IGBT4 are set to turn ON when the IGBT1 and the IGBT2 turn OFF, the electric charge that is accumulated while the IGBT1 and the IGBT2 are ON is discharged via the IGBT3 and the IGBT4.

FIG. 5 is a perspective view of the hybrid integrated circuit according to the preferred embodiment.

The metal substrate 5 is made of an aluminum plate, which has an excellent heat dissipation effect. The surface of the metal substrate 5 is oxidized to form the insulating layer 6. On the insulating layer 6 of the metal substrate 5, the conductive paths 3, 3 are formed. The conductive paths 3, 3 incorporate the driver IC 17, the switching transistors Q1 and Q2, and the bootstrap capacitor C1. Each of the bootstrap capacitors C1, C3, and C4 is a ceramic capacitor that uses a ceramic as a dielectric, because the ceramic has a high dielectric constant and a high reliability.

As shown in FIG. 1 described above, the electrodes 1, 1 at both ends of the ceramic capacitor C1 are fixed to the conductive paths 3, 3 by the solders 4, 4. The surface of each of the solders 4, 4 is covered with the hard resin 7 such as an epoxy resin, so that the solder crack generated by thermal expansion of the metal substrate 5 is prevented.

Furthermore, both the ceramic capacitor C1 and the hard resin 7 are wholly covered with the soft resin 8 such as a silicone resin. When the switching transistors Q1, Q2, or the like in the pre-driver 18 turn ON and OFF, a pulse-shaped voltage is applied to the electrodes 1, 1 of the ceramic capacitor C1 as described above. Then, the ceramic 2 is distorted because of a piezoelectric phenomenon when the voltage is applied thereto via the electrodes 1, 1. When the voltage applied to the electrodes 1, 1 becomes zero, the ceramic 2 will recover its original shape. Such operation is repeated every time the pulse-shaped voltage is applied, so that the ceramic capacitor C1 vibrates.

Vibration of the ceramic capacitor C1 resonates with the metal substrate 5 so that a sound noise might be generated. However, in the hybrid integrated circuit device according to the preferred embodiment, the ceramic capacitor C1 and the hard resin 7 that covers the solder 4 are wholly covered with the soft resin 8. Accordingly, the soft resin 8 absorbs the vibration of the ceramic capacitor C1. This prevents the sound noise from being generated.

In the hybrid integrated circuit device according to the preferred embodiment, in order to improve a heat dissipation effect, a switching transistor driven by a driving pulse and a ceramic capacitor connected to the switching transistor are incorporated on a conductive path on an insulated metal substrate. However, the ceramic capacitor is wholly covered with a soft resin, and the soft resin absorbs vibration due to expansion and contraction caused when the ceramic capacitor is switched. As a result, it can be prevented that the metal substrate resonates and a sound noise is generated.

In addition, the solders that fix both ends of the ceramic capacitor to the conductive path are covered with a hard resin. As a result, the solders can be protected from a solder crack due to thermal expansion of the metal substrate.

What is claimed is:

1. A hybrid integrated circuit device into which a switching transistor driven by a driving pulse, and a ceramic capacitor connected to the switching transistor are incorporated on a conductive path on an insulated metal substrate, wherein
   both ends of the ceramic capacitor are fixed to the conductive path by solders,
   the solders are covered with a hard resin, and
   the ceramic capacitor and the hard resin are wholly covered with a soft resin such that the soft resin covers a lower surface of the ceramic capacitor.

2. The hybrid integrate d circuit device according to claim 1, wherein the soft resin is a silicone resin.

3. The hybrid integrated circuit device according to claim 1, wherein the hard resin is an epoxy resin.

4. The hybrid integrated circuit device according to claim 1, wherein the surface of the metal substrate is covered with a transfer molded epoxy resin.

\* \* \* \* \*